United States Patent [19]
Greeff et al.

[11] Patent Number: 5,719,908
[45] Date of Patent: Feb. 17, 1998

[54] DIGITAL/ANALOG BIT SYNCHRONIZER

[75] Inventors: Roy Edgar Greeff; Glenn Arthur Arbanas; Bruce Howard Williams, all of Salt Lake City, Utah

[73] Assignee: Unisys Corporation, Blue Bell, Pa.

[21] Appl. No.: 503,953

[22] Filed: Jul. 19, 1995

[51] Int. Cl.[6] ................................................ H03D 3/24
[52] U.S. Cl. ...................... 375/376; 375/375; 331/25; 327/12; 327/163
[58] Field of Search .................... 375/327–328, 375/375–376; 331/14, 17, 18, 25, 1 A; 327/5, 12, 160, 163, 236

[56] References Cited

U.S. PATENT DOCUMENTS

| | | | |
|---|---|---|---|
| 4,546,486 | 10/1985 | Evans | 375/119 |
| 5,063,577 | 11/1991 | Arbannas et al. | 375/376 |
| 5,148,123 | 9/1992 | Ries | 331/4 |
| 5,477,177 | 12/1995 | Wong et al. | 327/156 |
| 5,485,484 | 1/1996 | Williams et al. | 375/376 |
| 5,570,395 | 10/1996 | Myers | 375/346 |
| 5,592,125 | 1/1997 | Williams | 331/1 A |
| 5,608,731 | 3/1997 | Upp et al. | 370/516 |

*Primary Examiner*—Young T. Tse
*Attorney, Agent, or Firm*—John B. Sowell; Mark T. Starr; John F. O'Rourke

[57] ABSTRACT

A high speed bit synchronizer is provided with a digital phase detector and a digital offset eliminating circuit. The output of the digital offset eliminating circuit is summed together with the output of the digital phase detector to compensate for the DC offset voltage generated by unsymmetrical digital data received at the input of the phase detector. Further, the phase error offset voltage produced at the output of the digital phase detector is linearized so that the lock point of the phase S-curve located on a linearized portion of a phase offset S-curve, thus, substantially eliminating all seeking and jitter that normally occurs at the lock point.

11 Claims, 9 Drawing Sheets

DIGITAL/ANALOG BIT SYNCHRONIZER

BACKGROUND OF THE INVENTION

1. Related Applications

The present invention is related to our U.S. application Ser. No. 08/171,059 filed 21 Dec. 1993, now U.S. Pat. No. 5,485,484 for a Digitally Implemented Phase and Lock indicator for a Bit Synchronizer.

2. Field of the Invention

The present invention relates to an improved high speed symbol or bit synchronizer. More particularly, the present invention relates to a novel linear phase detector that reduces instability lock point at the phase lock loop and also eliminates direct current offset induced by nonsymetrical data.

3. Description of the Prior Art

Digital phase detectors and digital lock detectors are known. In our U.S. Ser. No. 08/171,059 application, there is shown and described a high speed digital phase and lock detector circuit for a bit synchronizer which may be implemented in high speed logic elements such as ECL, TTL, CMOS, or gallium arsenide. The phase detector shown and described in this prior art application is subject to direct current (DC) offset caused by the digital data having more ones than zeros or vice versa. When DC offset occurs in a phase lock loop, a false error signal is generated which changes the frequency of the voltage controlled oscillator (VCO) in a phase lock loop. The false error signal will cause a change in the clock frequency which then creates a true phase error which is then corrected and the sequence repeats itself when the next DC offset signal is generated by the data.

It is well known that a plot of phase error voltage versus phase offset in degrees is referred to as a phase S-curve. In our aforementioned U.S. Pat. No. 5,485,484 a typical phase S-curve is shown having a central stable lock point which occurs at a zero crossover point on the S-curve. Any phase offset in the negative voltage direction slows the frequency of the clock and any phase offset in the positive direction increases the frequency of the clock. Due to the nonlinearity of the S-curve at the crossover point, a very slight phase offset in the positive direction will generate a much larger phase error voltage signal than that which occurs in the negative direction. This condition along with the aforementioned DC offset condition causes excessive seeking or jitter about the central stable lock point.

Accordingly, it would be desirable to provide a digital phase and lock detector which has a linear S-curve plot of phase error voltage versus degree of phase offset that eliminates jitter or seeking in the data clock. Further, it would be desirable to eliminate the steady state phase error induced by nonsymmetrical data.

SUMMARY OF THE INVENTION

It is a principal object of the present invention to provide a digital bit synchronizer having a linearized phase and lock detector.

It is a principal object of the present invention to provide a novel DC phase error eliminating circuit.

It is a principal object of the present invention to provide a novel bit synchronizer circuit which has zero steady state phase error offset.

It is another object of the present invention to provide a digital bit synchronizer circuit which may be implemented in a programmable array logic chip (PAL) or as a miniaturized integrated circuit.

It is another object of the present invention to provide a digital bit synchronizer which is linearized at the lock point of the phase S-curve so as to increase band width without jitter and enable faster acquisition of received data.

According to these and other objects of the present invention, there is provided a digital phase detector and a digital offset eliminating circuit having outputs which are summed together in a summing circuit to eliminate the direct current voltage induced by nonsymetrical data. The output of the summing circuit is fed into a voltage controlled oscillator of a phase lock loop which eliminates false phase error signals that could cause seeking or jitter.

DESCRIPTION OF THE PREFERRED EMBODIMENTS

Figure 1:
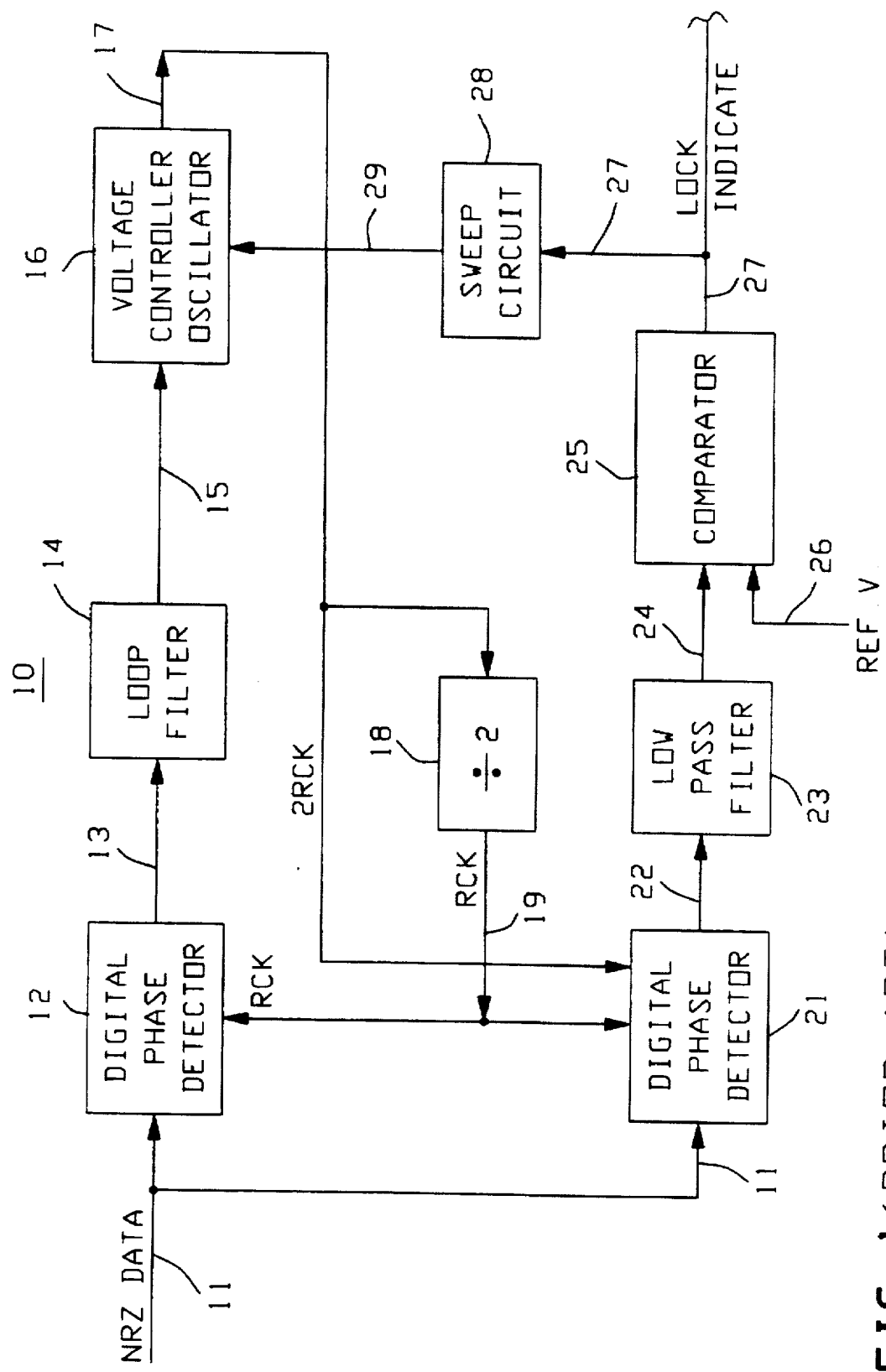
FIG. 1 is a block diagram showing a prior art bit synchronizer and phase lock indicator.

Refer now to FIG. 1 showing a block diagram of a prior art bit synchronizer 10. The bit synchronizer is shown having an input line 11 on which digital data such as nonreturn to zero (NRZ) data is provided. The data on line 11 is applied to a digital phase detector 12 to produce a phase error output signal on line 13 which is applied to a loop filter 14. The output of the loop filter on line 15 is applied as an analog error voltage to the voltage control oscillator 16 which in this case of the prior art, produces a clock signal at twice the data rate. The twice data rate clock on line 17 is applied to a divide by 2 circuit 18 to produce a coherent real clock signal on line 19 which is applied to the digital phase detector 12 and the digital phase detector 21. The data on line 11 is also applied to the digital phase detector 21 to produce an offset phase error signal on line 22 which is applied to a low pass filter 23. The output of the low pass filter 23 on line 24 is applied to a comparator 25 which is provided with a reference voltage input on line 26 and produces a lock indicator signal on line 27. When the error signal on line 24 exceeds the threshold voltage on line 26, the lock indicator signal on line 27 will stop the sweep circuit 28 which operates as an override control to produce a sweep signal on line 29 that is applied to the voltage control oscillator 16.

Figure 2:
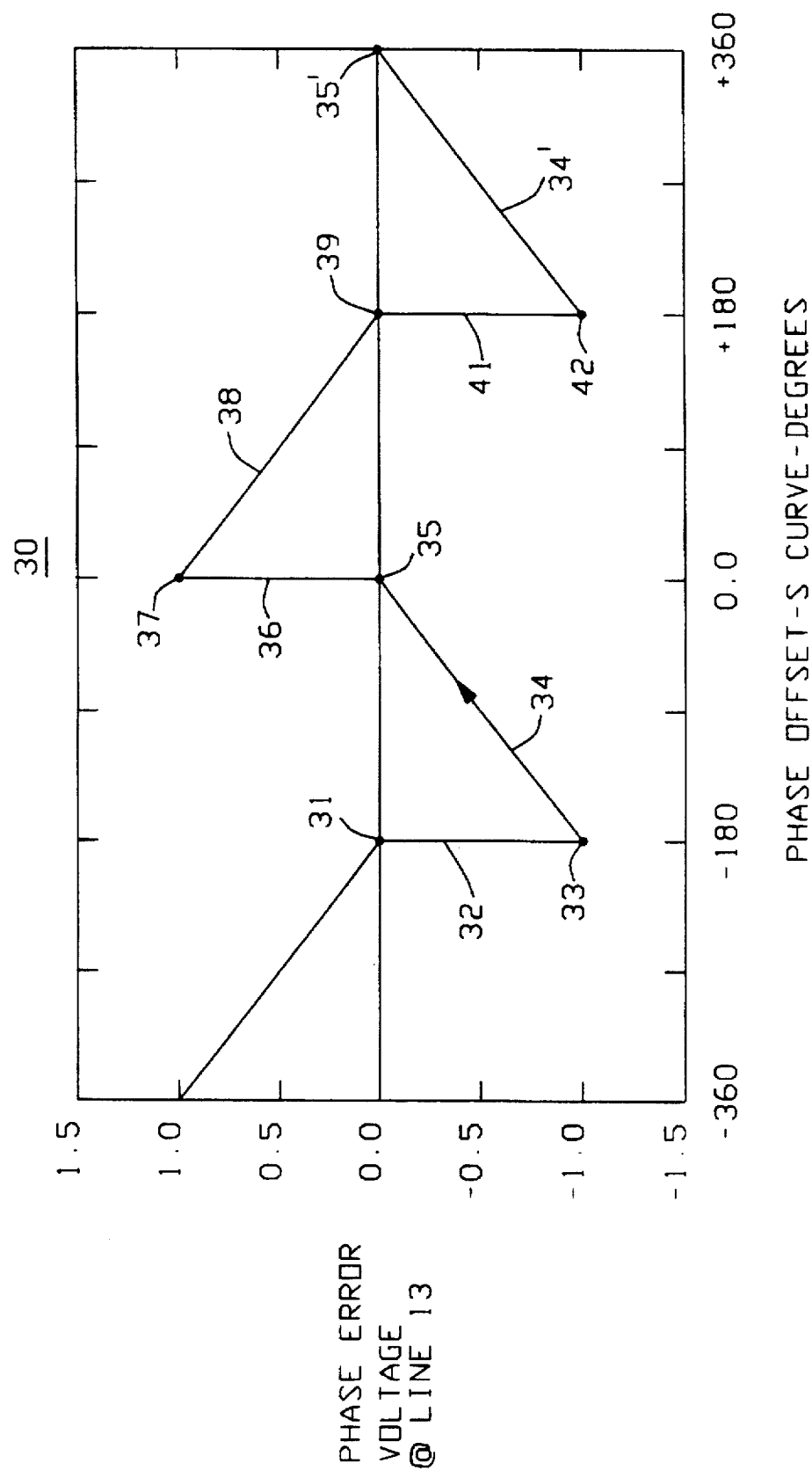
FIG. 2 is a drawing of a phase S-curve for the prior art phase detector shown in FIG. 1.

Refer now to FIG. 2 showing the phase offset phase error amplitude S-curve for the phase detector shown in FIG. 1. The phase S-curve 30 comprises an unstable lock point 31. A portion 32 of the waveform 30 represents a discontinuity and transition to point 33 which starts the linear negative portion 34 of the S-curve 30. When the S-curve reaches the stable lock point 35, it immediately continues on the discontinuity vertical portion 36 to a vertical point 37 before continuing on the positive portion 38 of a second linear path to an unstable lock point 39. At point 39 the S-curve encounters a third discontinuity 41 portion which carries the curve to point 42 where the S-curve continues as a repetition of the previously described S-curve linear portion 34'.

It will be understood that when the phase detector moves from its stable lock point 35 in the negative direction on curve portion 34 that an increasing negative voltage error signal is applied to the voltage control oscillator 16 slowing down the oscillator. However, when the phase detector generates a positive voltage at lock point 35 the waveform starts onto the discontinuity portion 36. From vertical point 37 the waveform continues as a maximum direction voltage down the positive portion of curve 38 actually slowing down or generating a positive voltage error signal as it approaches the unstable lock point 39. In actual practice, the portion of the waveform 36 is not completely vertical but has a slight angular slope from the vertical, thus, when there is noise on the data, it is possible to approach the stable lock point 35 from the negative direction and pass immediately from the stable lock point 35 to the vertical point 37 and may even slip all the way to the unstable lock point 39, then slip again and lock onto the next stable lock point 35'. Further, it will be noted that the transition from portion 34 of waveform 30 to portion 36 will cause an overshoot of the desired error correction signal requiring the negative portion of the curve to pull the voltage controlled oscillator back to the true lock point 35. Thus, it will be understood that a nonlinearized phase S-curve as shown in FIG. 2 creates a self-induced jitter around the lock point 35. As will be explained hereinafter, with reference to the preferred embodiment of the present invention and FIG. 4, this instability or jitter can be removed by continuing the linear portion of the waveform 34 through the lock point 35 to eliminate seeking and jitter.

Figure 3:
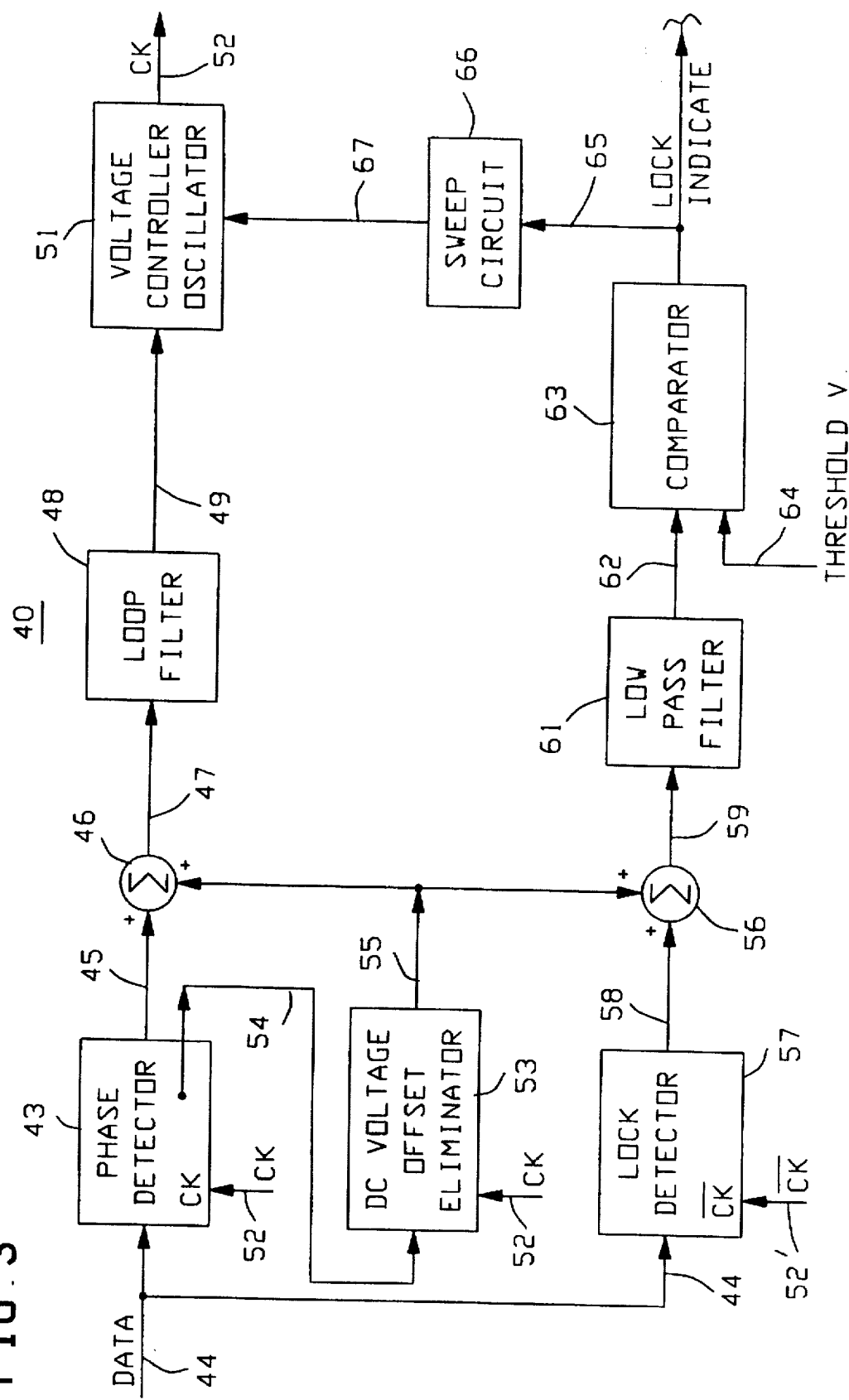
FIG. 3 is a block diagram of the improved digital/analog bit synchronizer of the present invention showing a novel DC voltage offset eliminator.

Refer now to FIG. 3 showing a block diagram of the improved digital/analog bit synchronizer of the present invention. The bit synchronizer 40 comprises a digital phase detector 43 having a data input line 44 for receiving digital data. The phase error signal on line 45 from phase detector 43 is applied to an analog summing circuit (or means) 46 which produces a corrected error signal on line 47 that is applied to a loop filter 48. The error signal on line 49 from the loop filter 48 is applied to an analog voltage controlled oscillator 51 which produces a coherent clock on line 52. The coherent clock on line 52 is applied to the phase detector 43 as well as to the novel DC voltage offset eliminator 53. The voltage offset eliminator also receives an input data signal on line 54 from the output of phase detector 43 that will be explained in greater detail hereinafter. The output of the DC voltage offset eliminator 53 on line 55 is applied as a correction signal to the aforementioned summing circuit 46. The correction voltage on line 55 is also applied to a second summing circuit 56 in the lock detector circuit. The lock detector 57 receives the digital data on line 44 as well as an offset not clock signal on line 52' and produces a voltage error signal on line 58 which is applied to the summing circuit 56 to produce a corrected detector signal on line 59 which is applied to a low pass filter 61. The output of the low pass filter 61 is applied as an error signal on line 62 to a comparator 63 which has a threshold voltage input on line 64 and produces as an output the aforementioned lock indicator signal on line 65. The lock indicator signal on line 65 is applied to a sweep circuit 66 which in turn produces a sweep control signal on line 67 when the error signal on line 62 is less than the threshold voltage set on line 64.

Figure 4:
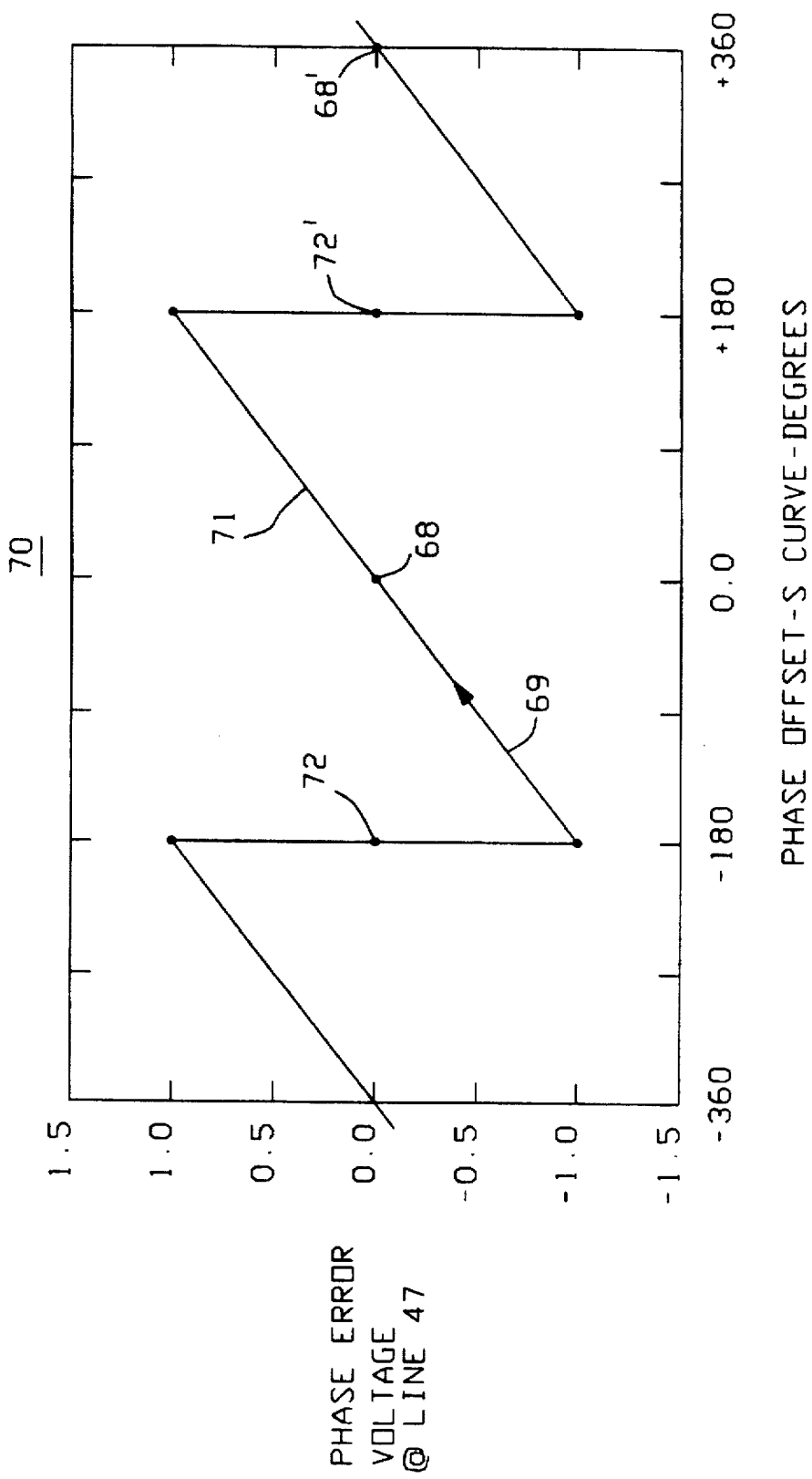
FIG. 4 is a drawing of a phase S-curve for the present invention phase detector showing a linearized S-curve about the lock points.

Refer now to FIG. 4 showing a phase S-curve for the present invention phase detector. The S-curve 70 is shown having a stable lock point 68 located intermediate the negative linear waveform portion 69 and the positive linear waveform portion 71. The unstable lock points 72 and 72' are similar to those described hereinbefore and the linearized S-curve repeats itself every 360°, thus has another stable lock point 68' located 360° from the stable lock point 68. Having explained the S-curves with reference to the prior art in FIG. 2 and the novel linearized waveform 70 which occurs through the lock point 68 it will now be understood that the self-induced jitter depicted in FIG. 2 has been eliminated in the novel linearized S-curve shown in FIG. 4. Having a stable linearized S-curve through the lock point 68, it is now possible to increase the phase lock loop band width which results in improving the acquisition time as well as the pull in range of the sweep circuit for the bit synchronizer.

Figure 5:
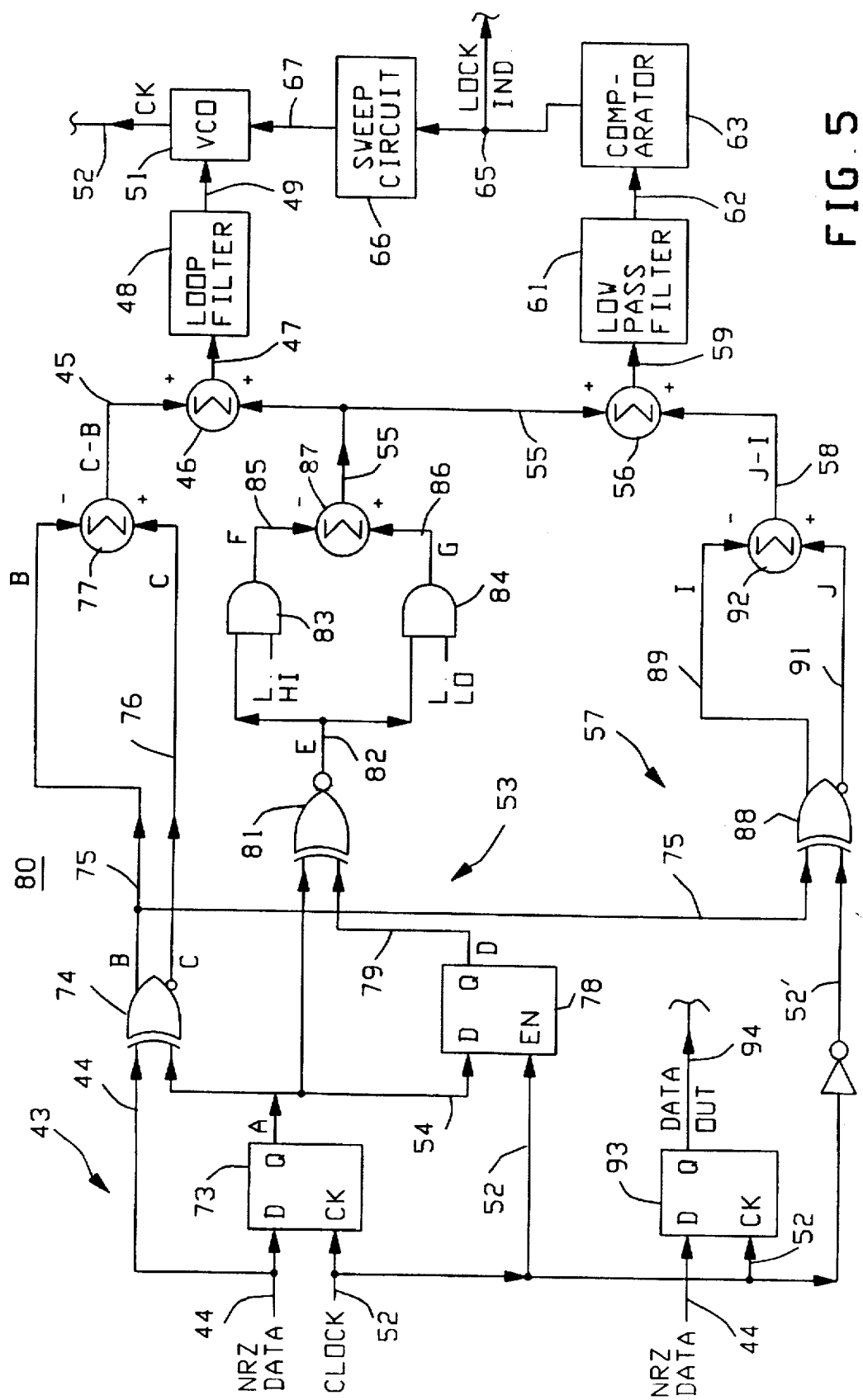
FIG. 5 is a schematic block diagram of the present invention bit synchronizer showing a digital/analog phase detector and lock indicator and a novel DC voltage offset eliminator.

Refer now to FIG. 5 showing a schematic block diagram of the present invention bit synchronizer 80 showing a digital/analog phase detector and a lock indicator. The bit synchronizer 80 basically comprises three elements. The first element is the phase detector 43, the second element is the offset eliminator 53 and the third element comprises lock detector 57. As explained with reference to FIG. 3, the binary data on line 44 is applied to phase detector 43 which comprises a flip-flop 73 which also has a clock input 52. The data output of flip-flop 73 on line 54 is applied to an exclusive OR circuit 74 along with the second input of the data on line 44. The two outputs labeled B and C from the exclusive OR circuit 74 are also numbered 75 and 76, respectively, and they are applied as negative and positive inputs to a first summing circuit 77 to produce the aforementioned phase error signal on line 45 indicated to be C-B.

The voltage offset eliminator 53 comprises a flip-flop 78 having an input comprising the data output on line 54 and a clock input on line 52 and produces a delayed signal output on line 79 which is applied to an exclusive OR circuit with the data signal on line 54. The negative output of exclusive OR circuit on line 82 also labeled output E, is applied to AND gates 83 and 84 each having second inputs indicated to be logic high and logic low signals respectively. The output of AND gates 83 and 84 on lines 85 and 86, also labeled outputs F and G, are applied to a third summing circuit 87 to produce a offset eliminator voltage on line 55 which is applied to the second summing circuit 46. The output of the second summing circuit 46 is applied to the loop filter 48 via line 47 and as explained hereinbefore produces the voltage error signal on line 49 which controls voltage controlled oscillator 51 to produce the coherent clock signal on line 52. As will be explained in greater detail hereinafter, the signal on line 55 compensates for nonsymetrical data which is appearing on line 45. The lock detector 57 comprises a not clock input on line 52' which is applied to an exclusive OR circuit 88 along with a second input from line 75 as a B output from exclusive OR gate 74.

The outputs from exclusive OR gate 88 on lines 89, 91 (outputs I and J) are applied as negative and positive inputs to a first lock detector summing circuit 92 to produce the aforementioned voltage error signal on line 58 which is applied to the second summing circuit 56 of the lock detector. A DC voltage offset correction signal on line 55 is also applied to summing circuit 56 to produce the aforementioned error signal output on line 59 which is applied to the low pass filter 61. The output of the low pass filter 61 on line 62 is applied to the comparator 63 to produce the aforementioned lock indicator signal on line 65 which is also applied as an input to the sweep circuit 66 to produce the sweep control signal on line 67 to the voltage controlled oscillator 51.

When synchronized the coherent clock on line 52 is synchronized with the data on line 44. The NRZ data on line 44 is shown being applied to a latch 93 along with a synchronizing clock signal on line 52 to produce the clock synchronize data on output line 94 from the bit synchronizer.

The aforementioned phase detector 43 comprises those elements starting at flip-flop 73 and ending at the output of first summing circuit 77 on line 45. Similarly, the DC voltage offset eliminator circuit 53 comprises those elements starting at flip-flop 78 and ending with the first summing circuit 87 on output line 55. Similarly, the lock detector 57 comprises those elements starting with exclusive OR circuit 88 and ending with the second summing circuit 56 having an output 59. Thus, the same numbers that are applicable to the lines and elements of FIG. 5 that were described with reference to FIG. 3 have employed the same numbers that operate in the same manner.

Figure 6:
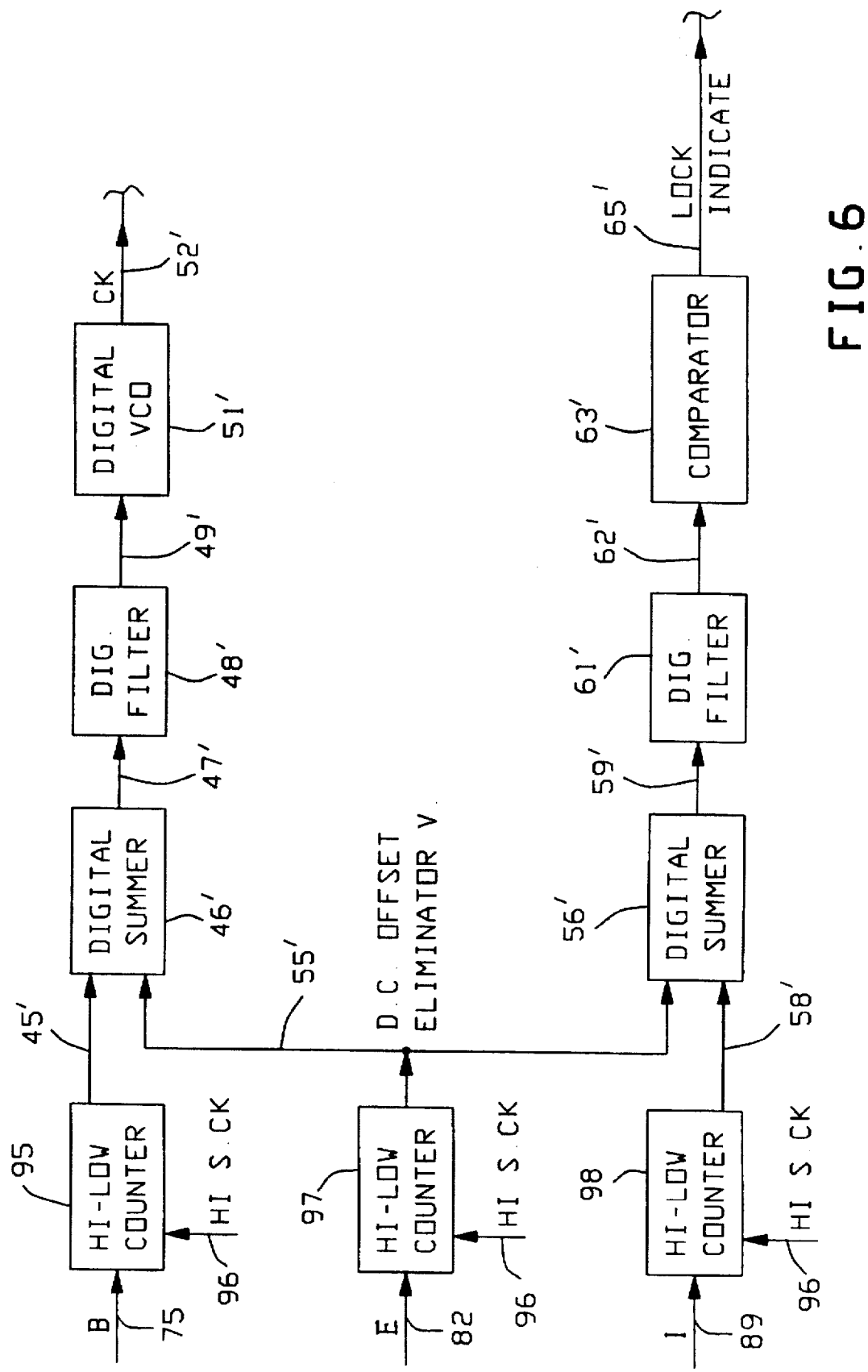
FIG. 6 is a schematic block diagram of a digital modification of the analog summing circuit portions of FIG. 5.

Refer now to FIG. 6 showing a schematic block diagram of a digital modification of part of the circuit shown in FIG. 5. The summing circuits shown in FIG. 5 are analog devices and may be replaced with complete digital devices to produce the desired output signals shown on lines 52 and 65 of FIG. 5. In this regard, the digital signal on line 75 is applied to a digital high-low counter 95 which has a high speed clock input 96. Preferably the clock is many times faster than the coherent clock on line 52 or 52'. The output of the high-low counter on line 45' is an indication of the duty cycle of the error signal. Stated differently the signal on line 45' is a digital indication of the occurrence of more zeros than ones or more ones than zeros which is the DC offset voltage indicator required for an input into the digital summer 46'. The digital summer 46' also has a DC offset eliminator voltage 55' input as a digital indication of the DC offset eliminator voltage. The output of digital summer 46' on line 47' is applied to a digital filter 48' to produce a loop filter error signal on line 49' which is applied to a digital voltage oscillator 51' which has an output indicated to be the digital clock signal 52'. Having used the similar numerals to those shown in FIGS. 3 and 5, it will be understood that the novel phase detector 43 may be implemented in a completely digital format or a digital/analog format as required for the particular application at hand.

Further, the DC voltage offset eliminator 53 is shown having an exclusive OR output 82 also labeled E which is now applied to a digital high-low counter 97 which produces an output shown as the DC offset eliminator voltage on line 55'. This offset voltage on line 55' is applied to a digital summer 56' which also has a second input produced by the high-low counter 98 which has a digital input 89 from the exclusive OR circuit 88 in the phase detector 57. The signal on line 89 or line I is applied to the high-low counter 98 to produce the voltage error signal on line 58' which applied to the digital summer 56'. The output of the digital summer 56' on line 59' is applied to a digital filter 61' to produce a lock detector error signal on line 62' which is applied to the comparator 63' which produces the aforementioned lock indicator signal on line 65' and in digital form is shown as a signal on line 65'.

Having explained the modified circuit of FIG. 6 and having previously explained the composite digital/analog circuit with respect to FIG. 5, it will be understood that the bit synchronizer 80 may be made in a completely digital form to produce digital outputs on line 52' and 65'.

Figure 7:
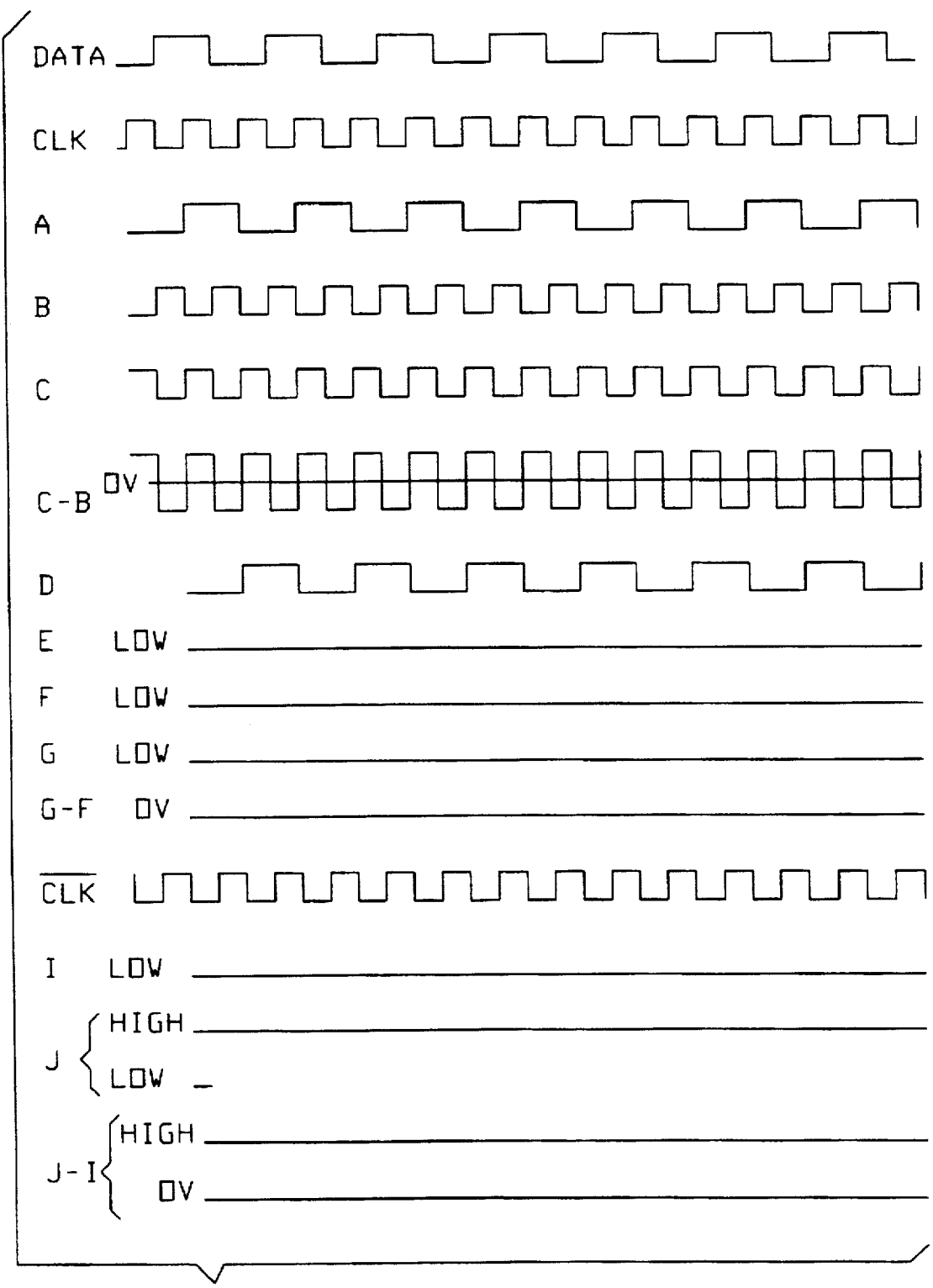
FIG. 7 is a waveform diagram of the signals which are produced by the novel bit synchronizer of FIG. 5 when the coherent clock is in phase and locked onto a symmetrical data stream.

Refer now to FIG. 7 showing a waveform diagram of the numerous signals which appear as letters on FIG. 5. These signals are produced by the novel bit synchronizer when the coherent clock is in phase and locked onto a symmetrical data stream. Thus, the first waveform is indicated to be symmetrical data and the second waveform is the coherent clock which coincides with or is synchronized with the symmetrical data. The outputs at points A, B, and C are those which appear lines 54, 75 and 76. In similar manner, the output shown as waveform C-B appears at line 45 of FIG. 5 as a phase detector output which has no offset correction. Since the data is symmetrical and the clock is in phase, the offset error on line 55 shown as G-F is zero voltage or zero offset correction. When the outputs on line 45 and 55 are combined a corrected phase error signal is produced on line 47. A waveform shown as not clock is being applied to the exclusive OR gate 88. It will be noted that by reversing the output lines 89 and 91 at the output of exclusive OR gate 88, the invertor in the not clock line 52' may be eliminated. Further, the output of the exclusive OR gate 88 shown as waveforms I and J are applied as the outputs to the summing circuit 92 thus produce a high signal on line 58 at the output of the summing circuit 92 as shown at the wave form J-I.

Figure 8:
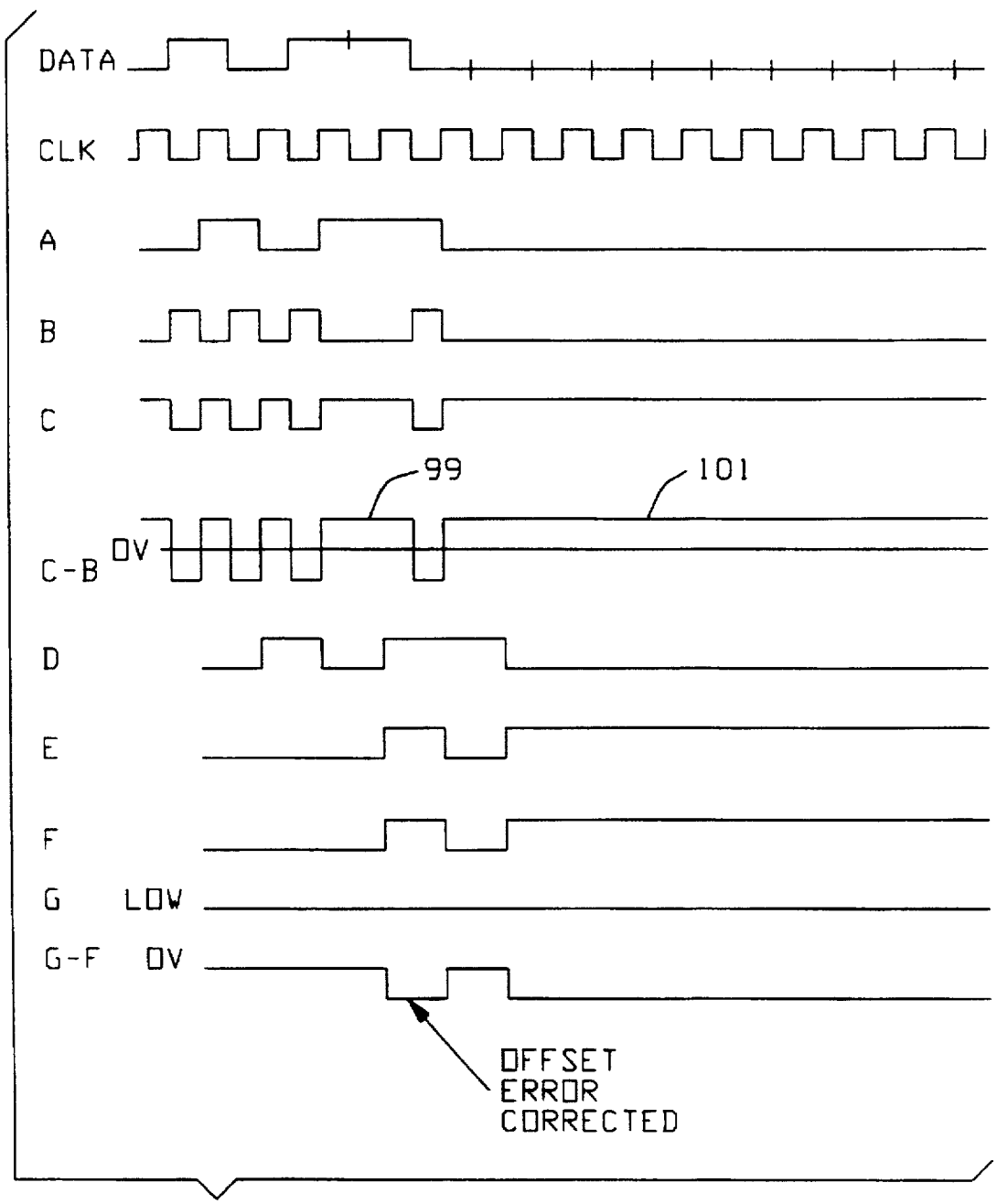
FIG. 8 is a waveform diagram of the signals which are produced by the novel bit synchronizer of FIG. 5 when the coherent clock is in phase and locked onto a nonsymetrical data stream.

Refer now to FIG. 8 showing a waveform diagram of the signals which are being produced by the novel bit synchronizer of FIG. 5 when the coherent clock is in phase and locked onto a nonsymetrical data stream. The first waveform indicated to be data is shown as being clocked by a coherent and symmetrical clock to produce the outputs A, B, and C in the phase detector of FIG. 5. When these outputs B and C are combined in the first summing circuit 77, they produce the signals shown as C-B which is not symmetrical to the zero voltage line, thus, the portions 99 and 101 of the waveform C-B represent DC components being generated by nonsymetrical data. In order to compensate for this DC offset shown at waveform portions 99 and 101 a DC offset eliminator circuit 53 combines the signals produced on lines F and G in the first summing circuit 87 to produce the offset correction signal 55 shown as signal G-F which is the inversion of the logic shown at waveform E. Thus, any type of logic implementation can produce the waveform E and the offset error compensation signal G-F waveform is a voltage level signal. Having explained the DC offset that occurs when the received data stream is not symmetrical it will be appreciated that no false phase error signals are being produced at line 49 as the input to the voltage controlled oscillator 51.

Figure 9:
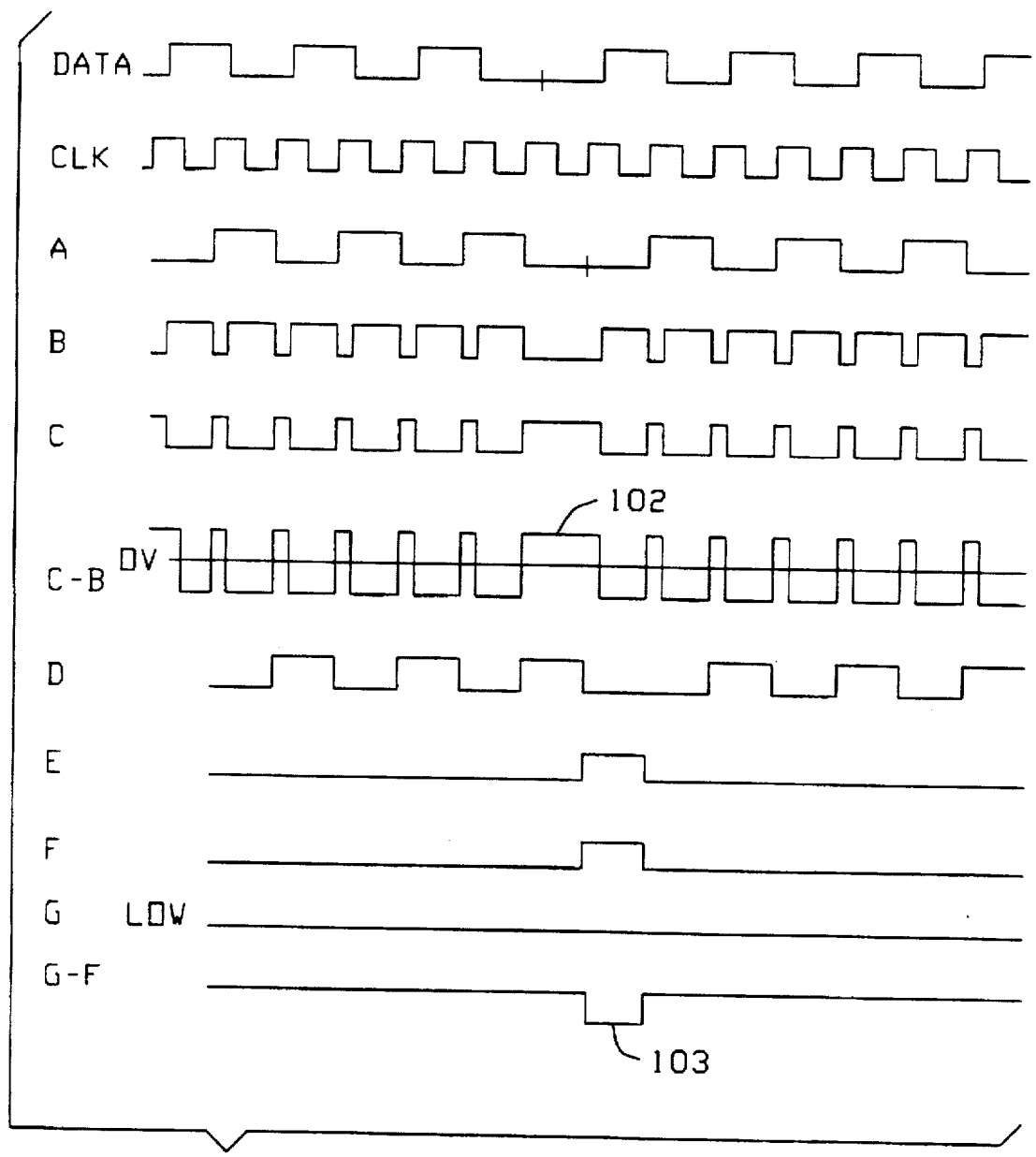
FIG. 9 is a waveform diagram of the signals which are produced by the novel bit synchronizer of FIG. 5 when the coherent clock is out of phase and not locked onto a nonsymetrical data stream.

Refer now to FIG. 9 showing the waveform signals which are produced by the novel bit synchronizer of FIG. 5 when the coherent clock is out of phase with the incoming data and is not locked onto a nonsymmetrical data stream. It will be noted that the waveform C-B in FIG. 9 is the uncompensated phase error signal similar to the signal produced in FIG. 7 which was symmetrical. The unsymmetrical signal C-B in FIG. 9 produces a DC bias which would cause the VCO 54 to reduce the error bias to zero, thus creating a waveform similar to that shown in the waveform C-B in FIG. 7.

Further, since there is unsymmetrical data shown on the first waveform there is a DC offset voltage 102 being produced which must need compensation. This voltage produced as the offset error is shown at pulse 102 of waveform C-B and is compensated for by the offset eliminator voltage on line 55 which produces the waveform G-F and compensation pulse 103.

Having explained a novel bit synchronizer which includes a novel DC voltage offset eliminator circuit it will be appreciated that two features are included in the present circuit not heretofore included in the prior art. First, the corrected phase signal on line 47 is being produced as a linear curve or linear line through the lock point 68 and further the DC offset voltage caused by unsymmetrical data is completely eliminated by the novel DC voltage offset eliminator circuit 53. Thus, the improved bit synchronizer is capable of wider band width in the phase lock loop which results in faster acquisition. The jitter which is associated with instability at the lock point 68 is minimized by the linear waveform through the lock point.

What is claimed is:

1. A high speed bit synchronizer for generating a coherent clock synchronized with a received digital data stream, comprising:

a digital phase detector having an input for receiving said digital data stream and producing a clocked data output, first summing means having a first input coupled to the clocked data output of said digital phase detector, offset eliminating means having an input coupled to the phase detector and a correction signal output coupled to a second input of said first summing means, a loop filter, said first summing means having positive inputs and a summed voltage output coupled to said loop filter, a voltage controlled oscillator having an input coupled to the filtered summed voltage output and having the coherent clock with a steady state phase offset, and the output of said first summing means having a linear output phase offset S-curve around the lock point of said phase detector, whereby seeking is substantially eliminated.

2. A high speed bit synchronizer as set forth in claim 1 which further includes a digital lock detector having an input coupled to said digital data stream and an output coupled to a second summing means, said second summing means having a second input coupled to the output of said offset eliminating means, a low pass filter having an input coupled to the output of said second summing means for producing an adjusted error signal output, and a comparator coupled to receive said adjusted error signal output for producing a lock indication signal at the true lock point for said phase detector.

3. A high speed bit synchronizer as set forth in claim 1 wherein said digital phase detector comprises a flip-flop having a clocked data output coupled to a first exclusive OR gate, said first exclusive OR gate having a second input coupled to said data stream and having a phase error signal output.

4. A high speed bit synchronizer as set forth in claim 3 wherein said digital phase detector further comprises a third summing means coupled to the first input of the first summing means and to said exclusive OR gate, and the output of said offset eliminating means being coupled to the second input of said first summing means for producing a phase error correction signal adjusted for the occurrence of unsymmetrical data.

5. A high speed bit synchronizer as set forth in claim 4 wherein said offset eliminating means comprises a second flip-flop having a clocked data output and a clock data input, and a second exclusive OR gate having an input coupled to the output of said second flip-flop for producing an offset correction signal.

6. A high speed bit synchronizer as set forth in claim 5 wherein said offset eliminating means further includes gating means coupled to the second exclusive OR gate, and fourth summing means coupled to the output of said gating means for producing said correction signal output at the output of said offset eliminating means.

7. A high speed bit synchronizer as set forth in claim 1 wherein said digital phase detector comprises a third summing means coupled to said first summing means which comprises a digital summing circuit for producing a digital adjusted phase error signal, and wherein said voltage control oscillator comprises a digital voltage controlled oscillator coupled to the output of said digital summing circuit.

8. A high speed bit synchronizer as set forth in claim 7 wherein said offset eliminating means comprises a high-low digital counter having a digital output coupled to an input of said digital summing circuit.

9. A high speed bit synchronizer as set forth in claim 1 which further comprises lock detector means coupled to the coherent clock and to said digital data stream for indicating a true lock point on said phase offset S-curve.

10. A high speed bit synchronizer as set forth in claim 9 wherein said lock detector means comprises a fifth summing means coupled to said second summing means.

11. A high speed bit synchronizer as set forth in claim 10 wherein said lock detector means further comprises a third flip-flop coupled to a third exclusive OR gate having an output coupled to said fifth summing means.

\* \* \* \* \*